(12) United States Patent
Huang

(10) Patent No.: US 12,113,001 B2
(45) Date of Patent: Oct. 8, 2024

(54) LEAD FRAME ASSEMBLY HAVING A PLURALITY OF DICING HOLES

(71) Applicant: CHANG WAH TECHNOLOGY CO., LTD., Kaohsiung (TW)

(72) Inventor: Chia-Neng Huang, Kaohsiung (TW)

(73) Assignee: CHANG WAH TECHNOLOGY CO., LTD., Kaohsiung (TW)

( * ) Notice: Subject to any disclaimer, the term of this patent is extended or adjusted under 35 U.S.C. 154(b) by 372 days.

(21) Appl. No.: 17/721,072

(22) Filed: Apr. 14, 2022

(65) Prior Publication Data

US 2023/0187324 A1 Jun. 15, 2023

(30) Foreign Application Priority Data

Dec. 13, 2021 (TW) .................................. 110214789

(51) Int. Cl.
*H01L 23/495* (2006.01)
*H01L 21/56* (2006.01)

(52) U.S. Cl.
CPC ...... *H01L 23/49565* (2013.01); *H01L 21/561* (2013.01); *H01L 23/49537* (2013.01); *H01L 23/49548* (2013.01); *H01L 23/49558* (2013.01); *H01L 23/4952* (2013.01); *H01L 23/49534* (2013.01); *H01L 2924/181* (2013.01)

(58) Field of Classification Search
CPC ......... H01L 2924/181; H01L 23/49558; H01L 23/4952; H01L 23/49537; H01L 23/49548; H01L 23/49565; H01L 21/561
See application file for complete search history.

(56) References Cited

U.S. PATENT DOCUMENTS

| | | | | |
|---|---|---|---|---|
| 10,424,535 B2* | 9/2019 | Huang | ................. | H01L 33/486 |
| 10,424,694 B2* | 9/2019 | Huang | ................. | H01L 33/0033 |
| 11,062,980 B2* | 7/2021 | Shibuya | ............. | H01L 21/4842 |
| 2012/0025361 A1* | 2/2012 | Ito | ........................ | H01L 24/97 |
| | | | | 257/676 |
| 2018/0096953 A1* | 4/2018 | Huang | ................. | H01L 24/48 |
| 2020/0227343 A1* | 7/2020 | Huang | ................. | H01L 33/486 |

* cited by examiner

*Primary Examiner* — Alonzo Chambliss
(74) *Attorney, Agent, or Firm* — MUNCY, GEISSLER, OLDS & LOWE, PC

(57) ABSTRACT

A lead frame assembly includes a lead frame body, an encapsulant unit, and dicing positioning units. The lead frame body includes lead frame units, an outer frame portion extending around the lead frame units, and through holes formed on the outer frame portion. The encapsulant unit includes a lower encapsulating portion, and an upper encapsulating portion formed on the lower encapsulating portion. The dicing positioning units are respectively located at the through holes, and each includes an adhesive layer which partially fills a corresponding one of the through holes and which is formed with at least one dicing positioning hole. The dicing positioning units define at least one first dicing positioning line and at least one second dicing positioning line.

11 Claims, 5 Drawing Sheets

LEAD FRAME ASSEMBLY HAVING A PLURALITY OF DICING HOLES

CROSS-REFERENCE TO RELATED APPLICATION

This application claims priority of Taiwanese Utility Model Patent Application No. 110214789, filed on Dec. 13, 2021.

FIELD

The present disclosure relates to a lead frame assembly.

BACKGROUND

In the manufacturing of a chip packaging device, chips which are disposed on lead frame units are subjected to a packaging process, and then the resultant lead frame assembly is subjected to a dicing process along positioning holes serving as dicing markers and formed on an outer frame portion of the lead frames units, so as to obtain a plurality of chip packaging devices that are separated from one another.

However, conventionally, the positioning holes are formed on the outer frame portion at the time when an electrically conductive sheet is etched to form a plurality of the lead frame units. When such lead frame units are subjected to injection molding using an encapsulating material during the packaging process, misalignment between the mold and the lead frame units or extrusion of the encapsulating material would result in an offset between the positioning holes and an encapsulating layer formed after the packaging process. Therefore, the dicing process may be not precisely conducted on the lead frame assembly including the encapsulating layer, and the thus obtained chip packaging devices would have a great difference in size.

SUMMARY

Therefore, an object of the present disclosure is to provide a lead frame assembly which can alleviate at least one of the drawbacks of the prior art.

According to the present disclosure, a lead frame assembly includes a lead frame body, an encapsulant unit, and a plurality of dicing positioning units.

The lead frame body is made of an electrically conductive material, and includes a plurality of lead frame units, an outer frame portion and a plurality of through holes. The lead frame units are arranged in an array and are connected to one another. The outer frame portion extends peripherally around the array of the lead frame units and is connected to a part of the lead frame units that are immediately adjacent to the outer frame portion. The through holes are formed on the outer frame portion.

The encapsulant unit includes a lower encapsulating portion which fills spaces formed in each of the lead frame units and between adjacent ones of the lead frame units, and an upper encapsulating portion which is formed on a top surface of the lower encapsulating portion and which is partially formed on a top surface of each of the lead frame units.

The dicing positioning units are respectively located at the through holes. Each of the dicing positioning units includes an adhesive layer which is formed with the encapsulant unit in a same process to partially fill a corresponding one of the through holes and which is formed with at least one dicing positioning hole that has a diameter smaller than a diameter of the corresponding one of the through holes. The dicing positioning units are configured to define at least one first dicing positioning line extending along a first direction and at least one second dicing positioning line extending along a second direction.

BRIEF DESCRIPTION OF THE DRAWINGS

Other features and advantages of the present disclosure will become apparent in the following detailed description of the embodiments with reference to the accompanying drawings, of which.

DETAILED DESCRIPTION

Figure 1:
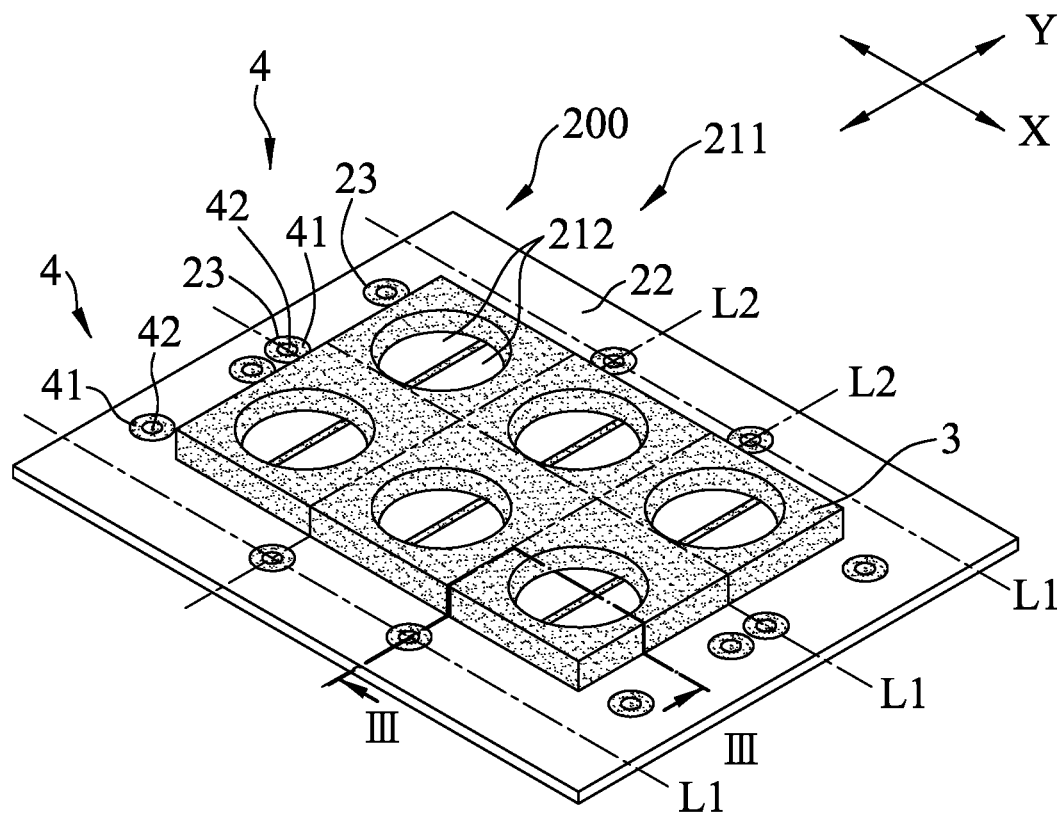
FIG. 1 is a schematic view illustrating a first embodiment of a lead frame assembly according to the present disclosure.

Before the present invention is described in greater detail, it should be noted that where considered appropriate, reference numerals or terminal portions of reference numerals have been repeated among the figures to indicate corresponding or analogous elements, which may optionally have similar characteristics.

Figure 2:
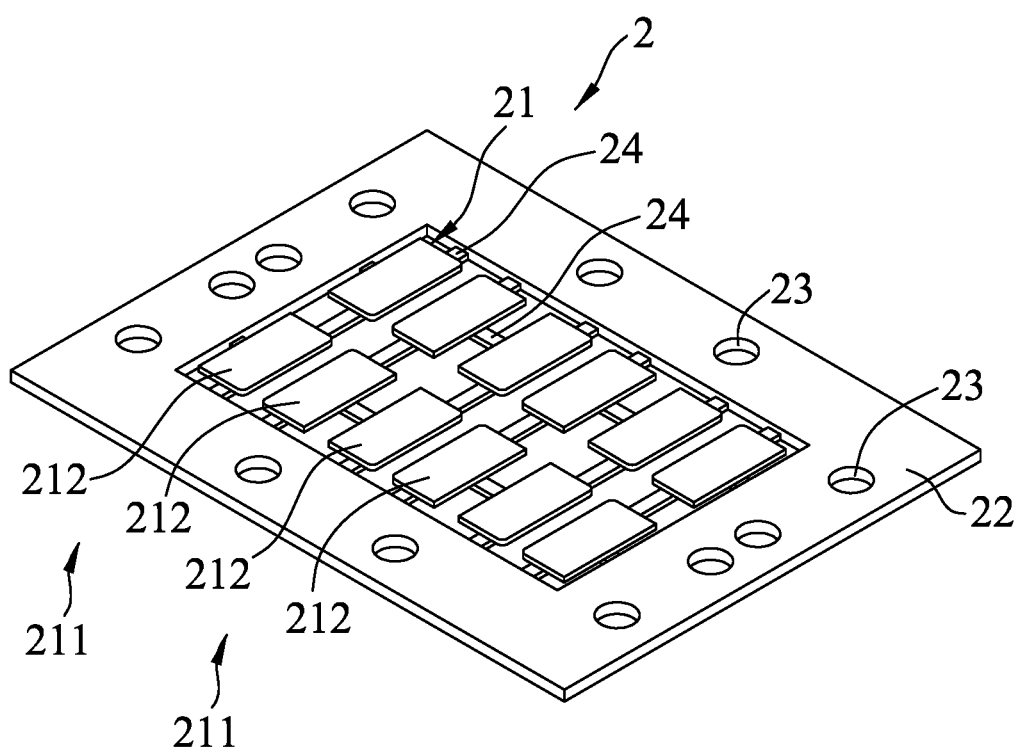
FIG. 2 is a schematic view illustrating a lead frame body of the first embodiment of the lead frame assembly according to the present disclosure.
Figure 3:
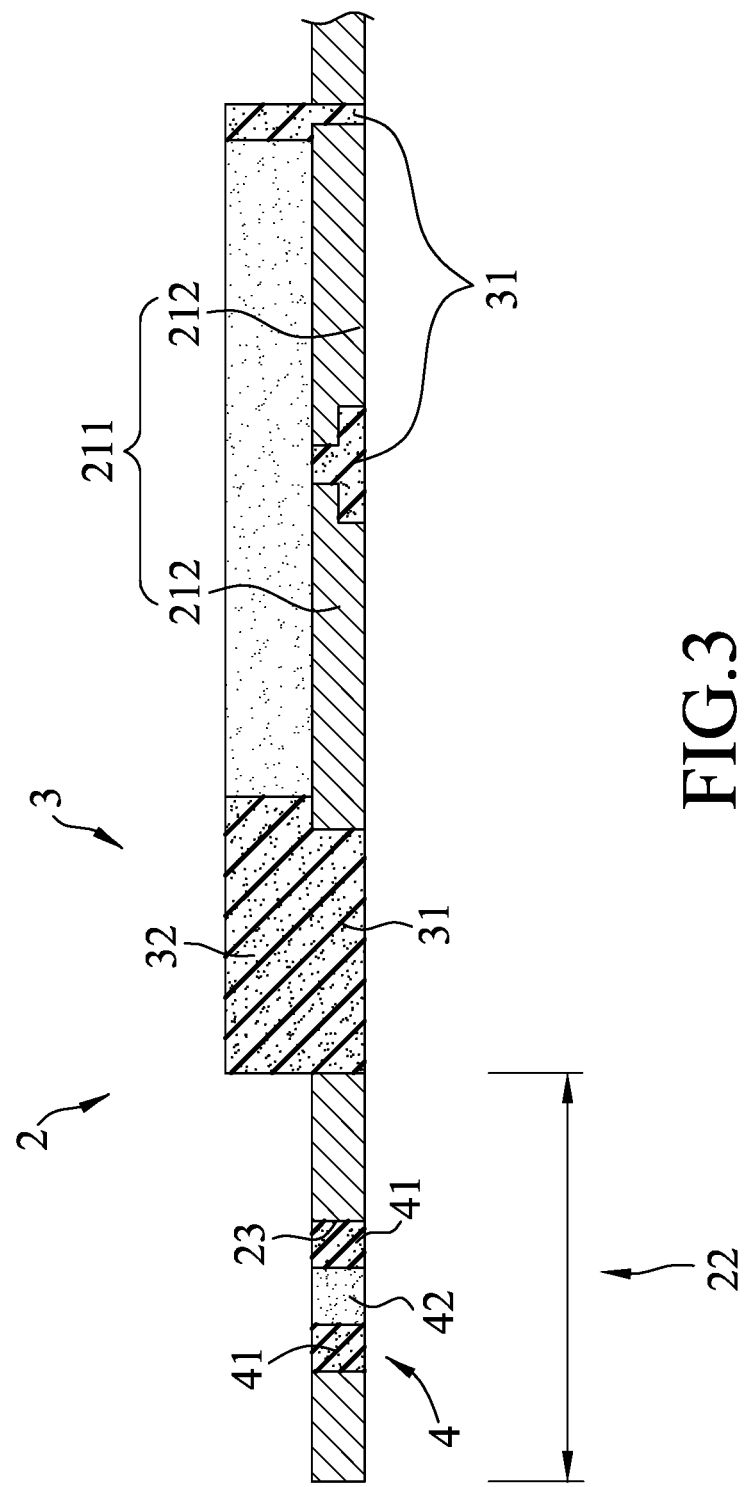
FIG. 3 is a schematic cross-sectional view taken along line III-III of FIG. 1.

Referring to FIGS. 1 to 3, a first embodiment of a lead frame assembly 200 of the present disclosure includes a lead frame body 2, an encapsulant unit 3, and a plurality of dicing positioning units 4.

The lead frame body 2 is made of an electrically conductive material, for example, a copper-based alloy, an iron-nickel alloy, and the like. The lead frame body 2 includes a plurality of lead frame units 21, an outer frame portion 22, a plurality of through holes 23, and a plurality of connecting pins 24.

The lead frame units 21 are arranged in an array and are connected to one another. The array of the lead frame units 21 may include a plurality of rows and a plurality of columns respectively extending in a first direction (X) and a second direction (Y), such that the lead frame body 2 is formed to have a tetragon shape (e.g., a rectangular shape in this embodiment). The first direction (X) traverses to the second direction (Y). In this embodiment, the first direction (X) is perpendicular to the second direction (Y). Each of the lead frame units 21 includes at least one die pad 211. In this embodiment, the die pad 211 of each of the lead frame units 21 is adapted for accommodating a semiconductor chip (such as light emitting diode chip) disposed thereon, and has two electrodes 212 which are spaced apart from each other.

The outer frame portion 22 extends peripherally around the array of the lead frame units 21, and has a tetragon shape (e.g., a rectangular shape in this embodiment). To be specific, the outer frame portion 22 has four inner side surfaces which are connected to one another to form four corners and which extend peripherally around and away from the array of the lead frame units 21.

The through holes 23 are formed on the outer frame portion 22. The distribution of the through holes 23 is not particularly limited as long as the dicing positioning units 4 formed therein are capable of defining at least one first dicing positioning line L1 extending along the first direction (X) and at least one second dicing positioning line L2 extending along the second direction (Y), which will be described later. In certain embodiments, the through holes 23 may be formed adjacent to at least two of the inner side surfaces (e.g. two adjacent ones of the inner side surfaces which are connected to each other, or two opposite ones of the inner side surfaces) of the outer frame portion 22. In this embodiments, for each of the four inner side surfaces of the outer frame portion 22, a plurality of the through holes 23 each having a circular shape are formed adjacent thereto. However, in actual practice, the through holes 23 may be formed to have other shapes, such as square, ellipse, irregular, etc.

The connecting pins 24 connect the lead frame units 21 to one another in the array, and also connect the outer frame portion 22 to a part of the lead frame units 21 that are immediately adjacent to the outer frame portion 22, thereby allowing the lead frame units 21 to be integrally connected to the outer frame portion 22. In this embodiment, the electrodes 212 of any two adjacent ones of the lead frame units 21 are interconnected via a plurality of the connecting pins 24, and the electrodes 212 of the part of the lead frame units 21 that are immediately adjacent to the outer frame portion 22 are interconnected via a plurality of the connecting pins 24. It should be noted that the number, shape, and position of the connecting pins 24 may vary according to practical requirements, and are not limited to those described herein.

The encapsulant unit 3 includes a lower encapsulating portion 31 which fills spaces formed in each of said lead frame units 21 and formed between adjacent ones of the lead frame units 21, and an upper encapsulating portion 32 which is formed on a top surface of the lower encapsulating portion 31 and which is partially formed on a top surface of each of the lead frame units 21. The upper encapsulating portion 32 is disposed on a periphery of the die pad 211 (i.e., on the electrodes 212) of each of the lead frame units 21 so as to partially expose a top surface of the die pad 211.

The dicing positioning units 4 are respectively located at the through holes 23. To be specific, by taking the through holes 23 which are formed adjacent to each of the four inner side surfaces of the outer frame portion 22 as an example, each of the dicing positioning units 4 includes an adhesive layer 41 which is formed with the encapsulant unit 3 in a same process to partially fill a corresponding one of the through holes 23 and which is formed with at least one dicing positioning hole 42 that has a diameter smaller than a diameter of the corresponding one of the through holes 23. The dicing positioning units 4 are configured to define the at least one first dicing positioning line L1 extending along the first direction (X) and the at least one second dicing positioning line L2 extending along the second direction (Y). In this embodiment, the at least one first dicing positioning line (L1) and the at least one second dicing positioning line (L2) are parallel to two adjacent ones of the side surfaces of the outer frame portion 22, respectively. The adhesive layer of each of the dicing positioning units 4, the lead frame units 21, and the outer frame portion 22 may be flush with the lower encapsulating portion 31.

It should be noted that the dicing positioning hole 42 may have a circular shape as shown in FIG. 1, or other symmetrical or non-symmetrical shapes such as a dumbbell shape, an elliptical shape, etc., but not limited thereto, as long as the dicing positioning hole 42 is formed with a geometric center for dicing positioning.

In this embodiment, the adhesive layer 41 of each of dicing alignment positioning units 4 is formed with a respective one of the dicing positioning holes 42 (see FIG. 1).

Figure 4:
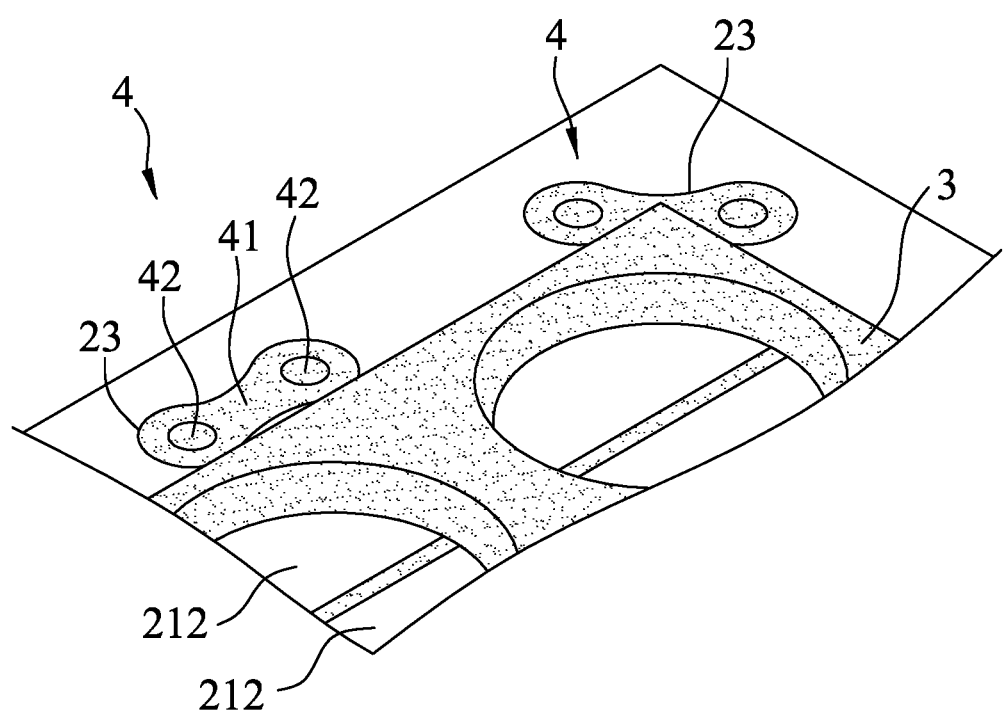
FIG. 4 is a fragmentary enlarged schematic view illustrating dicing positioning units of a second embodiment of the lead frame assembly according to the present disclosure.

Referring to FIG. 4, a second embodiment of the lead frame assembly 200 according to the present disclosure is generally similar to the first embodiment, except that in the second embodiment, the through holes 23 are further formed adjacent to at least one of the four corners of the outer frame portion 22 (note that one of the through holes 23 located adjacent to one of the four corners and one of the inner side surfaces of the outer frame portion 22 is shown in FIG. 4 for simplicity). In addition, the through holes 23 may extend to the two adjacent ones of the side surfaces of the outer frame portion 22 to have a dumbbell shape. For one of the dicing positioning units 4 located in a position corresponding to the through hole 23 formed adjacent to the at least one of the corners of the outer frame portion 22, the adhesive layer 41 is formed with two of the dicing positioning holes 42, and the two dicing positioning holes 42 may be located at two opposite terminal sides of the at least one of the corners. In addition, for some or all of the dicing positioning units 4 located in a position corresponding to the through holes 23 that are formed adjacent to the inner side surfaces of the outer frame portion 22, the adhesive layer 41 may be formed with two or more of the dicing positioning holes 42, and the dicing positioning holes 42 in this embodiment together define a plurality of the first dicing positioning lines L1 and a plurality of the second dicing positioning lines L2.

Figure 5:
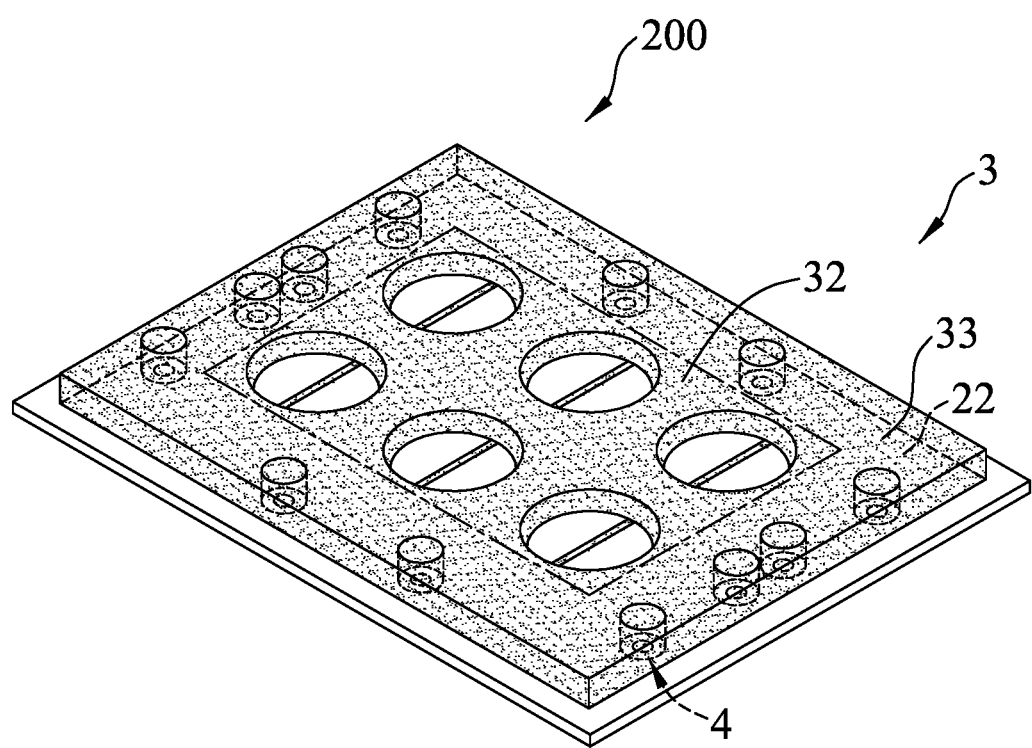
FIG. 5 is a schematic view illustrating an encapsulant unit of a third embodiment of the lead frame assembly according to the present disclosure.

Referring to FIG. 5, a third embodiment of the lead frame assembly 200 according to the present disclosure is generally similar to the first embodiment, except that in the third embodiment, the encapsulant unit 3 further includes an outer encapsulating portion 33 which is formed on a top surface of the outer frame portion 22 to expose the dicing positioning holes 42 of the dicing positioning units 4. The outer encapsulating portion 33 may be flush with the upper encapsulating portion 32, so as to permit the lead frame assembly 200 to have a substantially uniform height, thereby being able to facilitate a subsequently performed dicing process.

According to this disclosure, a method for manufacturing the first embodiment of the lead frame assembly 200 of the present disclosure is also provided. The method includes the following steps (A) to (C).

In step (A), a substrate made of an electrically conductive material, such as copper, copper-based alloy or iron-nickel alloy, was provided, and then subjected to an etching process to remove unnecessary parts, so as to obtain the lead frame body 2 shown in FIG. 2.

In step (B), a mold (not shown in the figures) was provided. The mold includes an alignment unit for aligning with the lead frame body 2, and a plurality of positioning bars which are disposed to correspond in position to the through holes 23 formed on the outer frame portion 22 of the lead frame body 2. Each of the positioning bars has a diameter smaller than the diameter of a corresponding one of the through holes 23.

In step (C), the lead frame body 2 was placed into the mold to align therewith and to allow the positioning bars to be inserted into the through holes 23, and then a packaging process was performed. Specifically, a high molecular weight encapsulating material was introduced into the mold to fill the spaces formed in each of the lead frame units 21 of the lead frame body 2, partially cover top surfaces of the electrodes 212, and fill gaps in the through holes 23 which were not occupied by the positioning bars. After curing of the high molecular weight encapsulating material, the encapsulant unit 3 and the dicing positioning units 4 are simultaneously formed, in which the adhesive layer 41 of a corresponding one of the dicing positioning units 4 was formed following curing of the high molecular weight encapsulating material filling the gap in the through hole 23. The cured product was taken out from the mold, and the positioning bars were removed to form the dicing positioning holes 42 located at a position corresponding to the through holes 23, thereby obtaining the lead frame assembly 200 (see FIG. 1).

In use, the semiconductor chips may be disposed on the lead frame units 21 of the thus obtained lead frame assembly 200, followed by performing a dicing process along the first direction (X) and the second direction (Y), such that a plurality of chip packaging devices that are separated from one another can be obtained. In certain embodiments, the dicing process may be performed by virtue of the first and second dicing positioning lines L1, L2 defined by the dicing positioning units 4 with the lead frame assembly 200 being cut at predetermined distances from the first and second dicing positioning lines L1, L2.

Since the dicing positioning units 4 and the encapsulant unit 3 are simultaneously formed in the same process, the dicing positioning units 4 and the encapsulant unit 3 are more precisely positioned relative to each other, thereby avoiding position offset therebetween during the manufacturing a conventional lead frame assembly in which the dicing positioning holes are formed before formation of an encapsulating layer. Therefore, the lead frame assembly 200 of the present disclosure is capable of producing, after the dicing process, chip packaging devices having a substantially uniform size.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A lead frame assembly, comprising:
    a lead frame body made of an electrically conductive material and including
        a plurality of lead frame units arranged in an array and connected to one another,
        an outer frame portion extending peripherally around the array of said lead frame units and being connected to a part of said lead frame units that are immediately adjacent to said outer frame portion, and
        a plurality of through holes formed on said outer frame portion;
    an encapsulant unit including a lower encapsulating portion which fills spaces formed in each of said lead frame units and between adjacent ones said lead frame units, and an upper encapsulating portion which is formed on a top surface of said lower encapsulating portion and which is partially formed on a top surface of each of said lead frame units; and
    a plurality of dicing positioning units respectively located at said through holes, each of said dicing positioning units including an adhesive layer which is formed with said encapsulant unit in a same process to partially fill a corresponding one of said through holes and which is formed with at least one dicing positioning hole that has a diameter smaller than a diameter of said corresponding one of said through holes, said dicing positioning units being configured to define at least one first dicing positioning line extending along a first direction and at least one second dicing positioning line extending along a second direction.

2. The lead frame assembly as claimed in claim 1, wherein the array of said lead frame units includes a plurality of rows and columns extending in the first and second directions, respectively.

3. The lead frame assembly as claimed in claim 2, wherein said outer frame portion has four inner side surfaces which are connected to one another to form four corners and which extend peripherally around and away from the array of said lead frame units.

4. The lead frame assembly as claimed in claim 3, wherein one of said through holes is located adjacent to one of said corners of said outer frame portion.

5. The lead frame assembly as claimed in claim 4, wherein for one of said dicing positioning units located in a position corresponding to said one of said through holes, said adhesive layer is formed with two of said dicing positioning holes.

6. The lead frame assembly as claimed in claim 5, wherein said two dicing positioning holes are located at two opposite terminal sides of said one of said corners.

7. The lead frame assembly as claimed in claim 3, wherein said through holes are formed adjacent to at least two of said inner side surfaces of said outer frame portion which are connected to each other, and said at least one first dicing positioning line and said at least one second dicing positioning line are parallel to two adjacent ones of said inner side surfaces of said outer frame portion, respectively.

8. The lead frame assembly as claimed in claim 1, wherein said adhesive layer of each of said dicing positioning units, said lead frame units and said outer frame portion are flush with said lower encapsulating portion.

9. The lead frame assembly as claimed in claim 1, wherein said encapsulant unit further includes an outer encapsulating portion which is formed on a top surface of said outer frame portion and exposing said dicing positioning units.

10. The lead frame assembly as claimed in claim 9, wherein each of said lead frame units includes at least one die pad adapted for accommodating a semiconductor chip disposed thereon, said upper encapsulating portion being disposed to expose a portion of a top surface of said die pad.

11. The lead frame assembly as claimed in claim 9, wherein said outer encapsulating portion is flush with said upper encapsulating portion.

\* \* \* \* \*